United States Patent [19]
Suzuki et al.

[11] Patent Number: 5,866,942
[45] Date of Patent: Feb. 2, 1999

[54] METAL BASE PACKAGE FOR A SEMICONDUCTOR DEVICE

[75] Inventors: Katsunobu Suzuki; Katsuhiko Suzuki; Akira Haga; Isamu Sorimachi; Hiroyuki Uchida, all of Tokyo, Japan

[73] Assignee: NEC Corporation, Japan

[21] Appl. No.: 639,194

[22] Filed: Apr. 26, 1996

[30] Foreign Application Priority Data

Apr. 28, 1995 [JP] Japan ................................. 7-127395

[51] Int. Cl.$^6$ ............................................... H01L 23/04
[52] U.S. Cl. ........................... 257/698; 257/778; 257/678
[58] Field of Search .................................. 257/668, 698, 257/778, 678, 702

[56] References Cited

U.S. PATENT DOCUMENTS

| | | | |
|---|---|---|---|
| 4,835,598 | 5/1989 | Higuchi et al. | 257/668 |
| 5,397,917 | 3/1995 | Ommen et al. | 257/698 |
| 5,450,290 | 9/1995 | Boyko et al. | 257/298 |
| 5,467,253 | 11/1995 | Heckman et al. | 257/698 |
| 5,561,322 | 10/1996 | Wilson | 257/720 |
| 5,592,025 | 1/1997 | Clark et al. | 257/698 |
| 5,619,070 | 4/1997 | Kozono | 257/698 |
| 5,640,047 | 6/1997 | Nakashima | 257/698 |

OTHER PUBLICATIONS

Sloan et al; Over Molded Pad Array Carrier (OMPAC) "A New Kid on the Block"; pp. 17–27 1994 Mar.; Nikkei Micro Device.

*Primary Examiner*—Olik Chaudhuri
*Assistant Examiner*—Nathan K. Kelloy
*Attorney, Agent, or Firm*—Hayes, Soloway Hennessey, Grossman & Hage, P.C.

[57] ABSTRACT

A laminate package structure for a semiconductor device having a high resistance to humidity, reliability and electrical performance. A polyimide layer and copper foil patterns are formed on a metal base in the form of metal sheet. The metal base comprises a ground pattern maintained at the ground potential, and a plurality of land patterns on which solder balls are formed. The copper foil pattern comprises an island pattern on which an LSI chip is mounted, and an internal wiring patterns connected to electrodes of the LSI chip. The metal base pattern and the internal wiring patterns are electrically interconnected through via-plugs formed in through-holes by an electrolytic plating. A cap is adhesively bonded to the laminated metal base or one of the metal foil patterns.

19 Claims, 14 Drawing Sheets

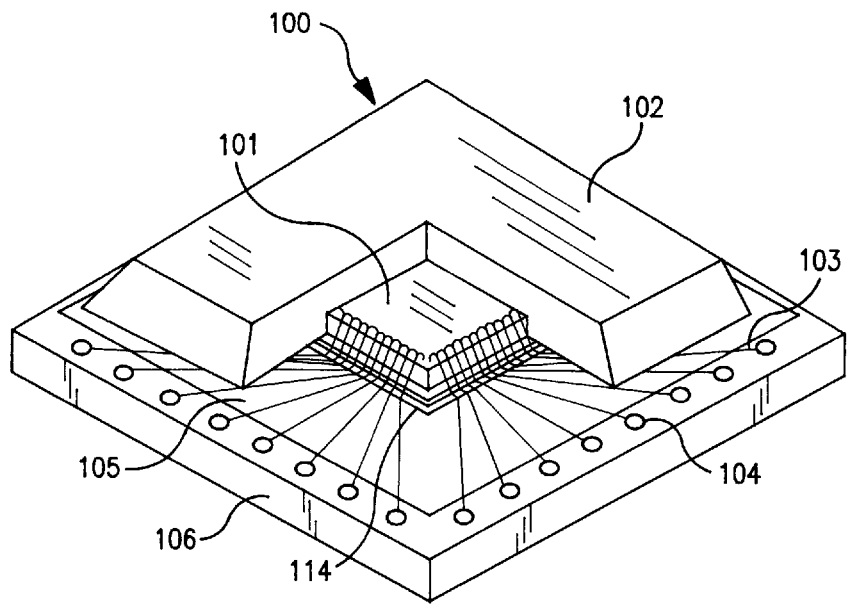
FIG. IA
PRIOR ART
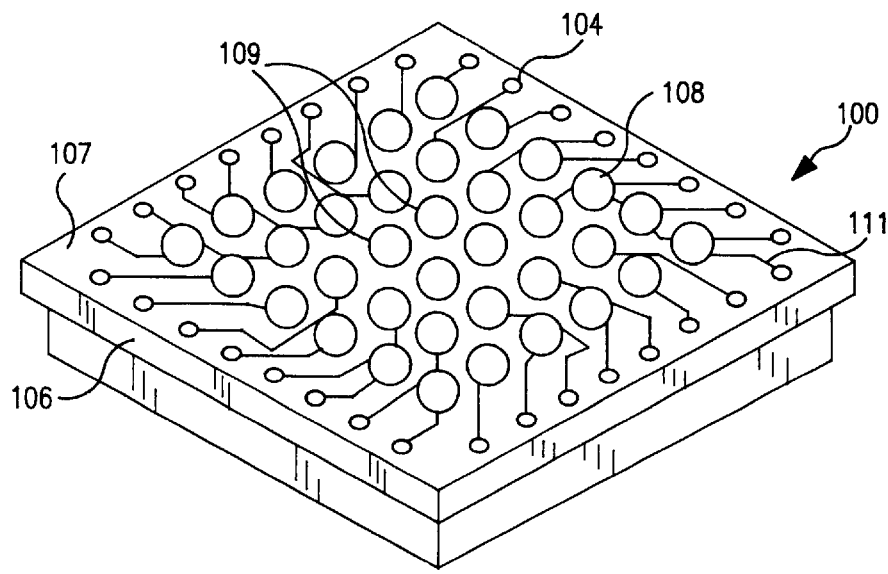
FIG. IB
PRIOR ART
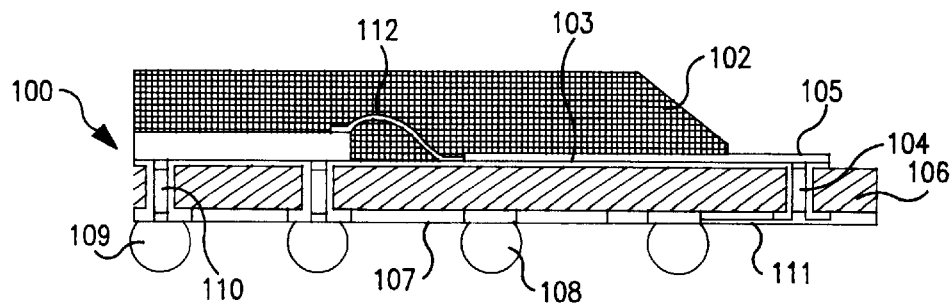
FIG. IC
PRIOR ART

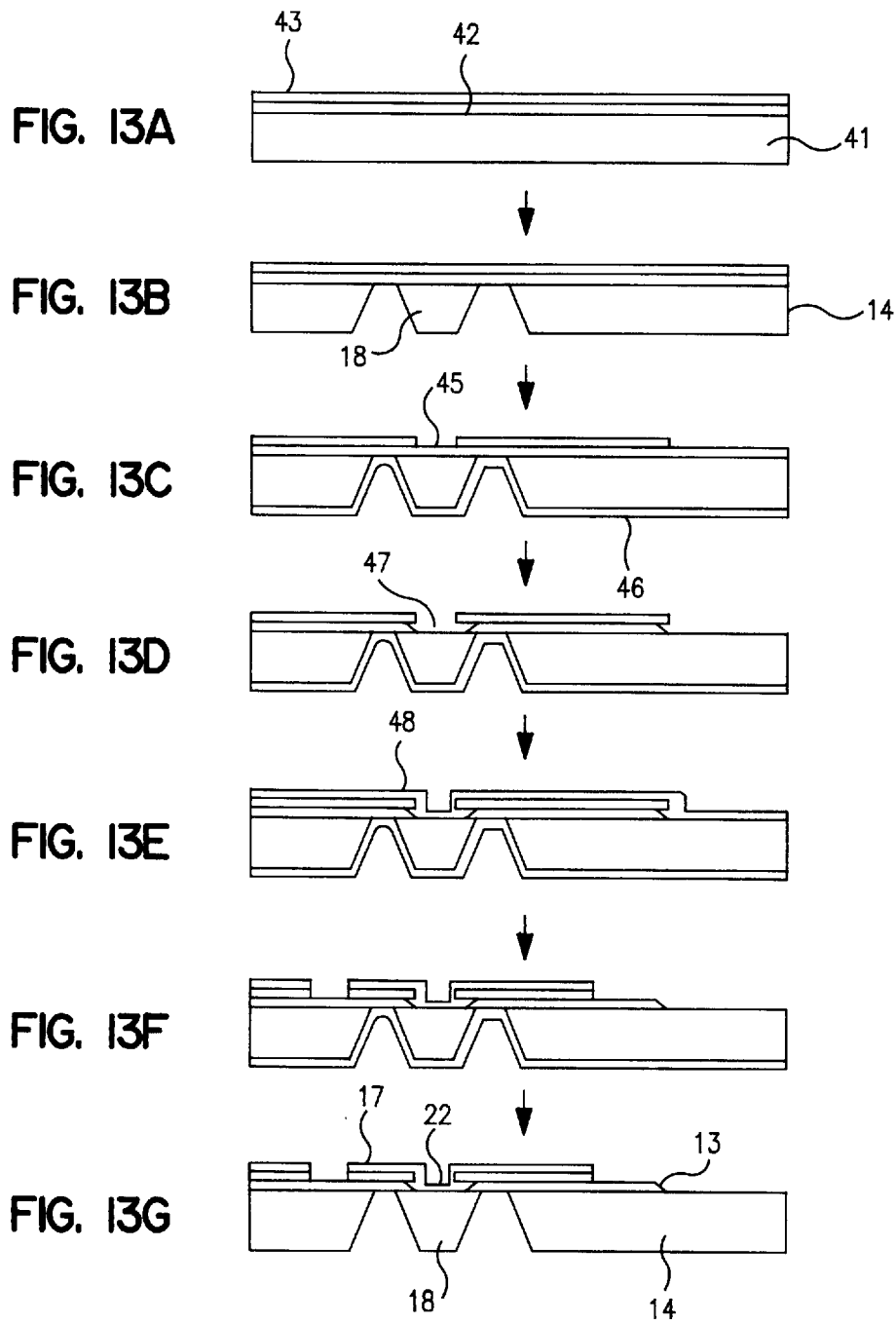

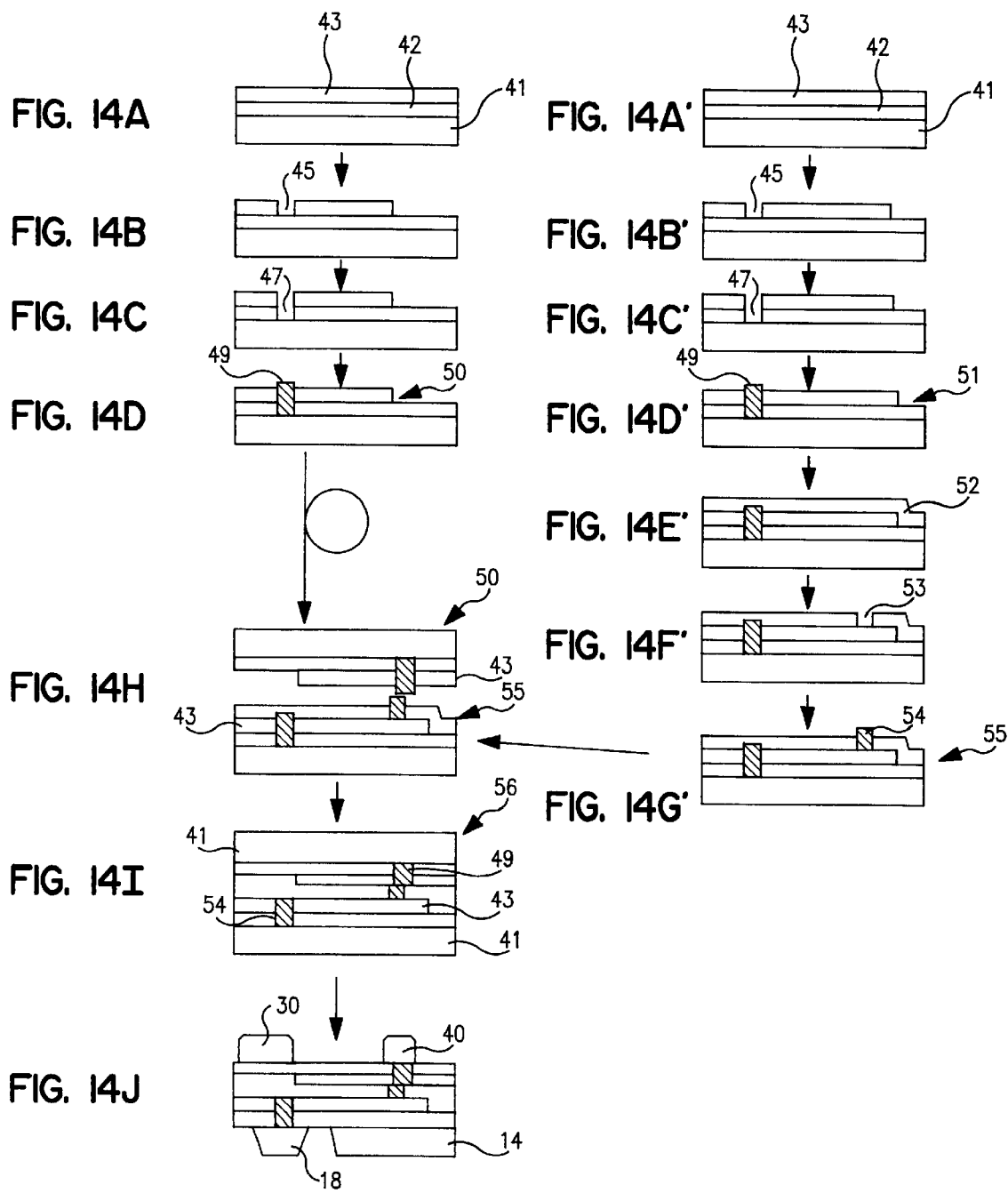

ns 1,866,942

METAL BASE PACKAGE FOR A SEMICONDUCTOR DEVICE

FIELD OF THE INVENTION

The present invention relates to a metal base package for a semiconductor device. In particular, the present invention is related to a laminated structure of a package for a semiconductor device which uses a metal base substrate.

DESCRIPTION OF THE RELATED ART

Recently, the structure of a package for a semiconductor device, referred to as BGA (BALL GRID ARRAY), has been proposed. A package structure of this type is disclosed in, for example, "THE FIRST VLSI PACKAGING WORKSHOP", NOVEMBER–DECEMBER, and "NIKKEI MICRODEVICES" 1994, March issue, and efforts are being paid to realize its implementation for practical use. A conventional BGA structure will now be described with reference to the drawings.

FIGS. 1A, 1B and 1C show a conventional BGA structure disclosed in "NIKKEI MICRODEVICES", 1994, March issue. FIG. 1A is a perspective view with a surface cap partly removed, FIG. 1B is a perspective view of the rear surface of the substrate, and FIG. 1C is a fragmentary cross-sectional view. An internal wiring (or a set of interconnects) 103 is formed on the front surface of a glass epoxy substrate 106, while an external wiring 111 is formed on its rear surface. In addition, an island pattern 114 for mounting LSI 101 thereon is formed on the surface.

The internal wiring 103 and the external wiring 111 are electrically connected together through a via-plug 104 around the package 100, and heat dissipating through-holes 110 are formed below the island pattern 114. A land pattern is formed on each distal end of the external wiring 111, and similarly a land pattern is formed directly below the heat dissipating through-holes 110. The rear surface of the substrate around the land patterns is coated by a solder resist 107 which is an insulating resin. The front surface of the substrate around the island pattern 114, bonding wires 112 and the internal wiring 103 is also coated by a solder resist 105.

LSI 101 is mounted on top of the island pattern 114 of the package 100, constructed in the manner mentioned above, with an adhesive, such as silver paste, and the electrodes of LSI 101 and the internal wiring 103 are connected together through bonding wires 112. Except for the LSI 101, the bonding wires 112, part of the internal wiring 103 and the central portion of the front surface of the substrate 106 (which is located inside the through-holes 104) are sealed by the sealant resin 102. After resin sealing, solder balls 108 and 109 are formed on the land pattern 107 located on the rear surface of the substrate 106. Such solder balls include a solder ball 108 for electrical connection and a solder ball 109 which is devoted for heat dissipation.

Another conventional BGA of the prior art is disclosed in "THE FIRST VLSI PACKAGING WORKSHOP", 1992, NOVEMBER–DECEMBER issue. Such prior art will be described with reference to drawings. In the structure of FIGS. 2A, 2B and 2C, an internal wiring 103 is disposed on the front side of a glass epoxy substrate 106, while an external wiring 111 is disposed on the rear surface. The internal wiring 103 and the external wiring 111 are electrically connected together through via-plugs 104 at given locations. An island pattern 114 is formed on the front surface of the substrate while a land pattern, not shown, is formed on the distal ends of the wiring on the rear surface of the substrate. The rear surface except for the land pattern and the area on the front surface other than that used for the bonding are coated by solder resists 107 and 105, respectively.

In the assembly of a semiconductor device, LSI 101 is mounted on the island 114 with silver (Ag) paste 115 interposed therebetween, and the electrodes of LSI 101 and the internal wiring 103 are connected together by bonding wires 112. On the front surface of the substrate 106, a central portion located inside the through-holes 104 is sealed by a plastic mold 113 (except for the LSI 101), the bonding wires 102 and part of the internal wiring 103. A solder ball 108 is disposed on the land pattern located on the rear surface of the substrate.

FIGS. 3A, 3B and 3C show a structure in which, in addition to the structure shown in FIGS. 2A, 2B and 2C, heat dissipating via-plugs 116 are formed in the rear surface of the LSI 101, and heat dissipating solder balls 117 are formed below and adjacent to the heat dissipating via-plugs 116. The heat dissipating via-plugs 116 and the heat dissipating solder balls 117 are connected together by part of the land pattern.

In yet another conventional BGA, there is ABGA disclosed in "NIKKEI MICRODEVICES", 1994, March issue. PBGA is an abbreviation of TAPE-BGA, and employs a flexible printed circuit board (also referred to as TAB). FIG. 4 is a cross section showing the structure of the PBGA. The flexible printed circuit board 118 is formed of an insulating polyimide, the opposite surfaces of which are formed with printed circuits 122. LSI's 120 are mounted on the opposite surfaces of the printed circuit board 118, and TAB (tape automated bonding) lead 121 is used to connect the electrodes of the respective LSI's 120 and the internal circuit 122.

A package support plate 123, referred to as a stiffener (glass polyimide substrate), is disposed around the outer periphery of the package 100 to compensate for a wanting rigidity of the flexible printed circuit board 118, and the via-plugs 119 are formed in the package support plate 123. A wiring pattern 122 on the flexible print substrate 118 and solder balls 124 on the support plate 123 are connected together through the via holes 119, and the solder balls 124 are connected to an external printed circuit board, not shown. In this manner, an electrical and mechanical connection between the external printed circuit board and package support plate 123 takes place through the solder balls 124 disposed around the outer periphery of the package.

In the conventional BGA package structures mentioned above, a connection between the internal wiring and the external wiring is made through via-plugs generally formed by a drilling and a plating technique. Disadvantageously however, it is difficult to completely fill the interior of the through-holes by the plating technique, which makes it likely that external humidity may find its way into the through-holes through interstices formed therein. The purpose of a solder resist is to cover openings including the through-holes in order to improve the humidity resistance of the package. However, when compared with hermetically sealed packages, for example, the solder-resist allows relatively easy ingress of moisture, which will seap into the through-holes or sealant resin (plastic mold). Then, there arises a problem that such moisture may cause a rupture of a resin layer as it expands during the soldering operation of the printed circuit board, or the moisture can cause corrosion of a passivation film on the LSI surface, thus degrading the reliability of the semiconductor devices.

Further disadvantageously, glass epoxy resin having a low thermal conductivity is used for the circuit board, thus reducing the heat dissipation from the rear surface of the LSI. In an attempt to further improve the heat dissipating capability, a plurality of heat dissipating via-plugs are formed in the rear surface of the LSI as illustrated in FIG. 3B, for example. However, the heat dissipating via-plugs cause a reduction in the humidity resistance and lead to an expansion and the rupture of the resin layer by the moisture, again disadvantageously degrading the reliability.

In addition, in conventional BGA's, a through-hole is generally formed by a drilling process, and hence tends to have a relatively large diameter. This poses a number of problems when it is desirable to manufacture a multi-pin package. Specifically, the strength of the substrate is degraded; the presence of the larger through-holes prevents to increasing the density of the wiring, which results in an increase in the number of substrates; since a printed circuit is often used in which the line width cannot be generally reduced, it becomes difficult to design an improved electrical transmission response for a micro-strip line, for example, and it is difficult to achieve an impedance matching within the BGA; and since the resin is used in providing an encapsulation, the electrodes of LSI and the bonding wires are covered by a resin having a dielectric constant equal to or greater than 5, causing a severe cross-talk noise propagating between adjacent wires or electrodes, precluding its use in a high frequency band.

On the other hand, the TBGA has a structure which allows solder bumps to be formed only around the package, and hence involves a difficulty in increasing the number of pins. In addition, since the wiring is extended to the outer periphery of the package, the wiring length is increased thus causing a signal delay.

SUMMARY OF THE INVENTION

In view of the foregoing, it is an object of the invention to provide a novel laminate package structure by improving a conventional BGA structure, in which an increase in the number of pins is realized, reliability is enhanced, and which is easily adapted to provide construction which enables the electrical performance of the LSI to be fully exploited.

The above objects are accomplished in accordance with the invention by providing a laminate package structure for a semiconductor device comprising a metal base pattern made of a metal sheet having copper or aluminium as a principal constituent and having a given pattern configuration, an insulating layer made of an organic insulating material and formed at least on the metal base pattern, and thin film patterns made of a metal foil formed on the insulating layer and having a given pattern configuration inclusive of interconnect patterns, the foil having copper or aluminum, for example, as a principal constituent. The metal base patterns include at least one ground pattern and a plurality of land patterns which are electrically insulated from each other and from the ground patterns, the ground pattern, the land patterns and the wiring pattern being electrically connected to each other through via-plugs which extend through the insulating layer at given locations.

A semiconductor device according to a preferred embodiment of the invention includes a semiconductor chip which is either mounted on the laminated structure by a bonding with an organic resin, a metal-mixed resin or a low melting metal, or connected to a bump by flip-chip bondings using a conductive resin or a low melting metal.

Since the laminate package structure for a semiconductor device according to the invention is constructed as a laminated structure, in which wiring patterns are formed on top of the metal base with the interposition of an insulating layer, when a semiconductor chip is mounted on one of the metal foil patterns, and then the laminate package structure is hermetically sealed by a metal or resin cap, the combination of the metal base and the cap provides a highly hermetic structure. The encapsulation of the semiconductor chip by the highly hermetic structure allows a high level of performance of the semiconductor device to be maintained. Thus, the present invention can be applied to the manufacture of high frequency semiconductor devices or a micro-strip line or the like, which meets the high performance requirements of such devices.

BRIEF DESCRIPTION OF THE DRAWINGS

FIGS. 1A, 1B and 1C are a perspective view with a cap partly cut away, a perspective view of the rear surface and a fragmentary cross-sectional view, respectively, of a first prior art;

FIG. 13 is a series of cross-sectional views illustrating sequential steps in manufacturing a laminate package structure according to an eighth embodiment of the invention;

FIG. 14 is a series of cross-sectional views illustrating sequential steps in manufacturing a laminate package structure according to a ninth embodiment of the invention.

DESCRIPTION OF THE PREFERRED EMBODIMENTS

Figure 2A:
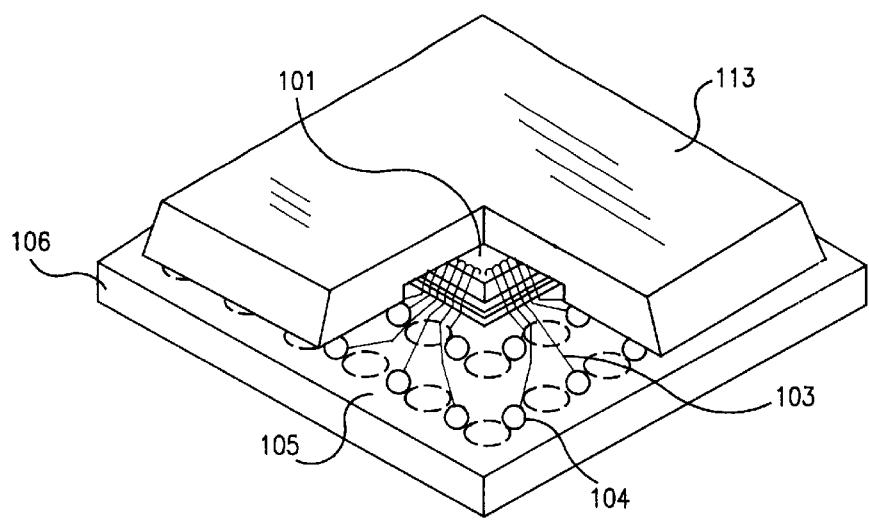
FIGS. 2A, 2B and 2C show a second prior art similarly to FIGS. 1A, 1B and 1C, respectively.
Figure 2B:
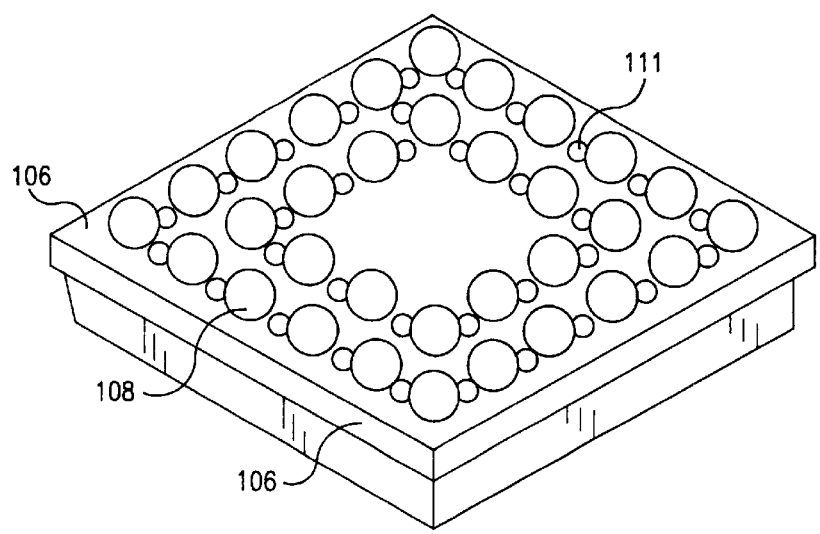
Figure 2C:
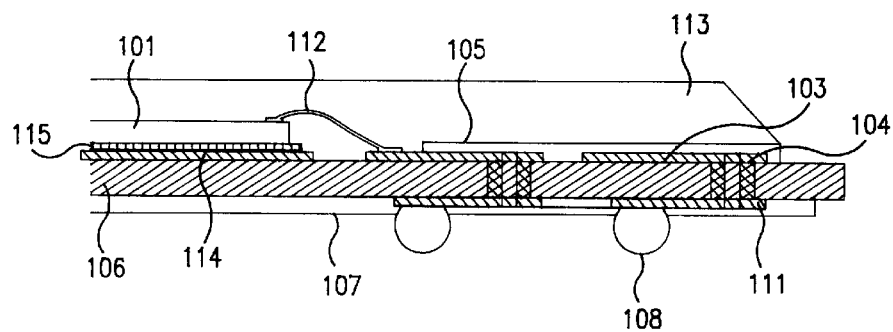
Figure 3A:
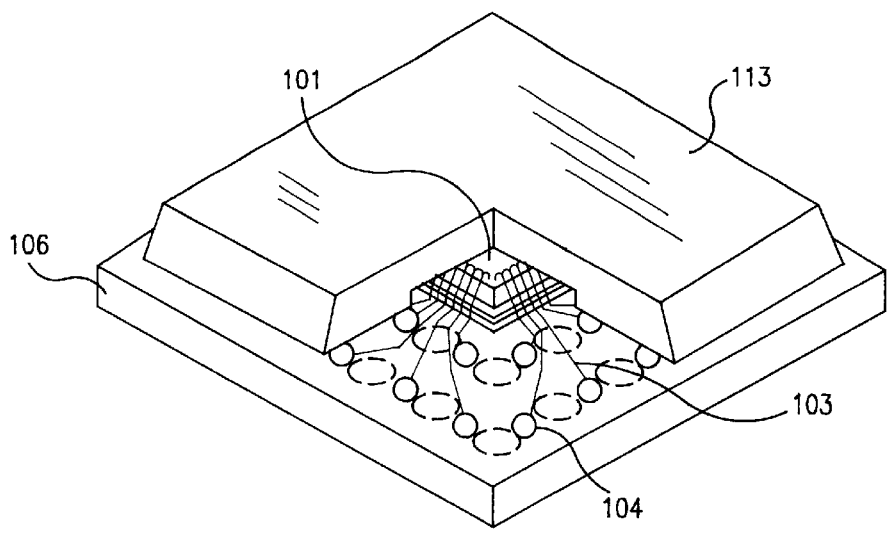
FIGS. 3A, 3B and 3C show a modified structure of the second prior art similarly to FIGS. 1A, 1B and 1C, respectively.
Figure 3B:
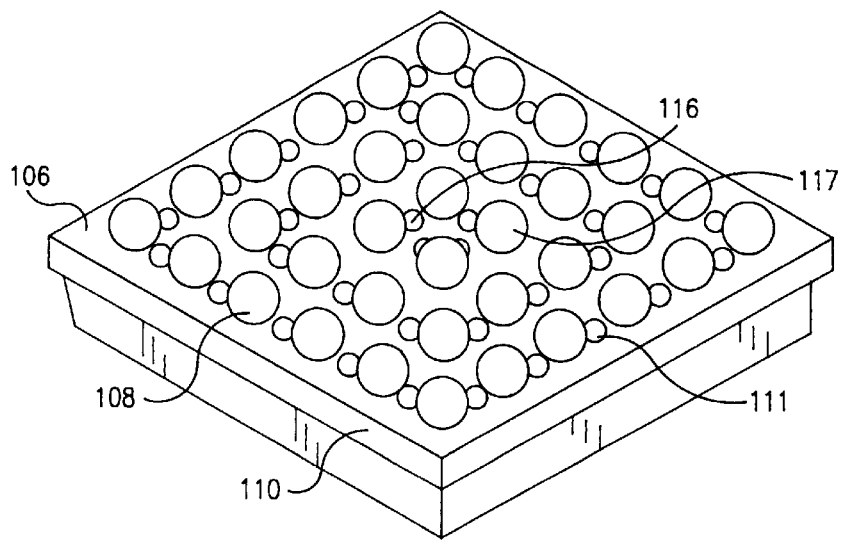
Figure 3C:
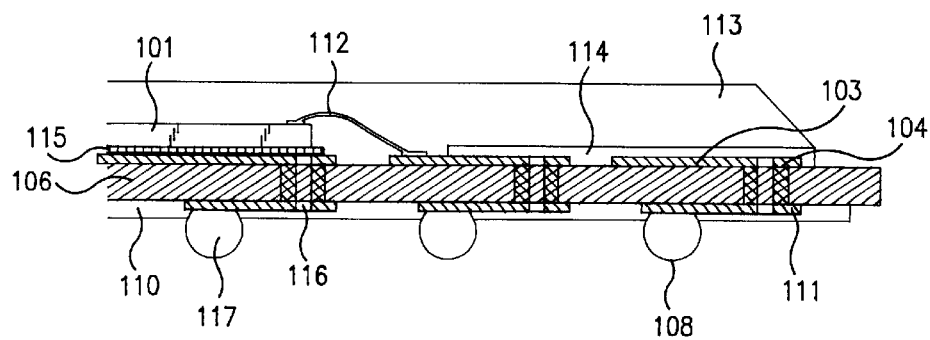
Figure 4:
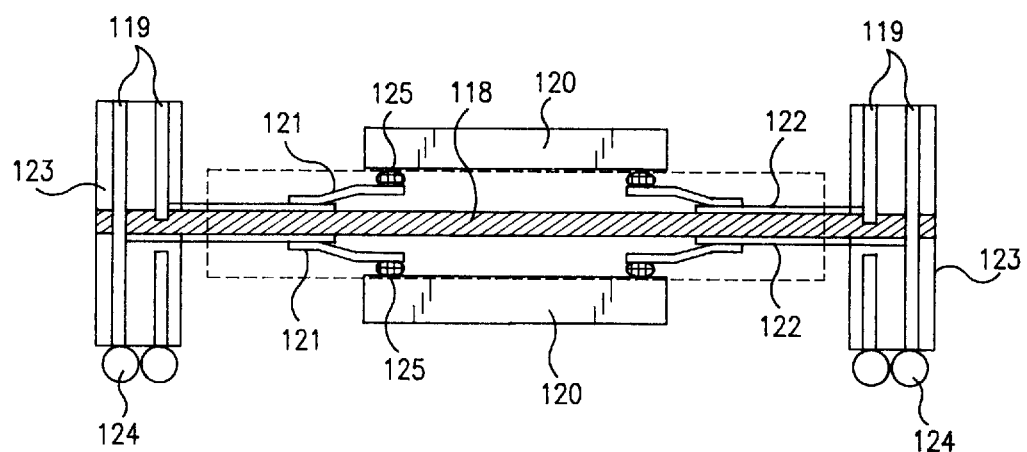
FIG. 4 is a cross-sectional view illustrating a third prior art.

Referring to the drawings, the invention will be described in more detail below in connection with several embodiments thereof. It is to be noted that throughout the drawings, similar elements are designated by like reference numerals or characters.

First Embodiment

Figure 5A:
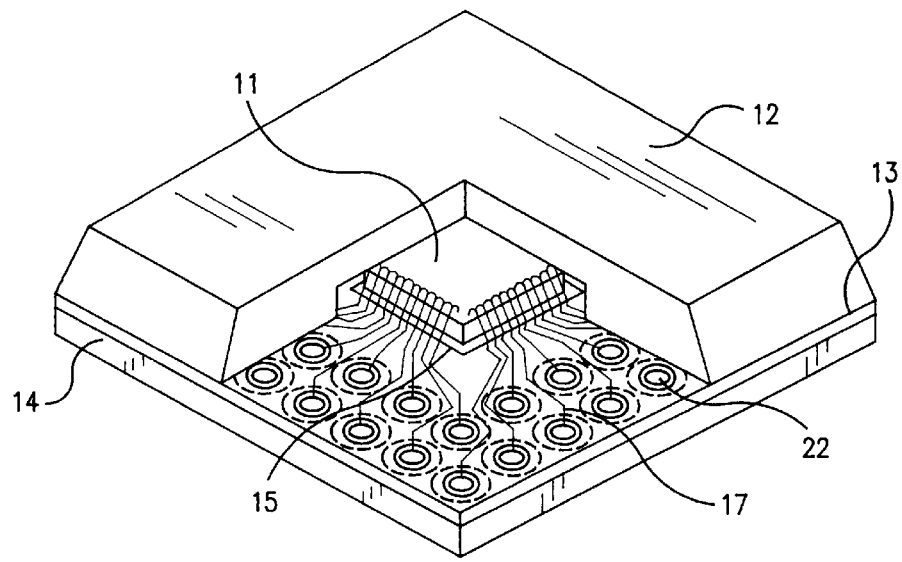
FIGS. 5A, 5B and 5C show, similarly to FIGS. 1A, 1B and 1C, respectively, a laminate package structure for a semiconductor device according to a first embodiment of the invention.
Figure 5B:
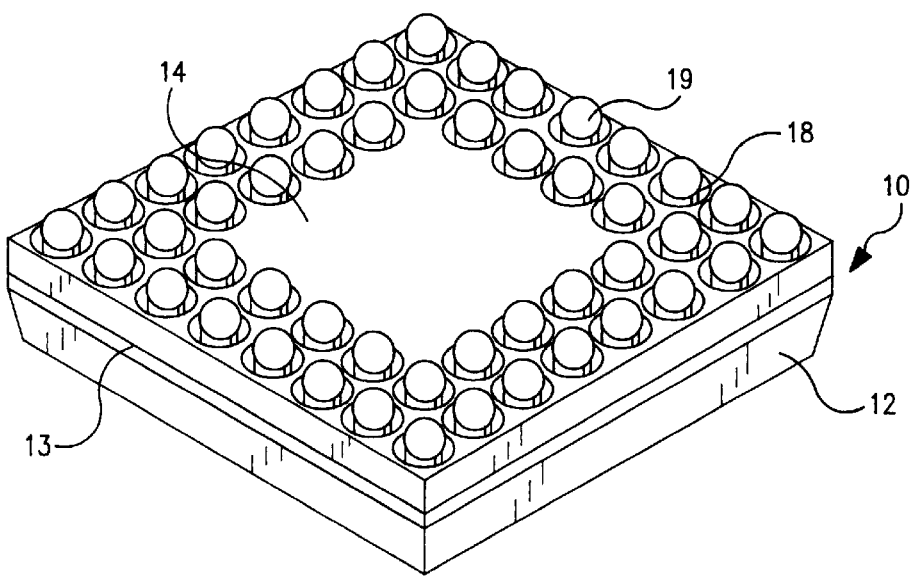
Figure 5C:
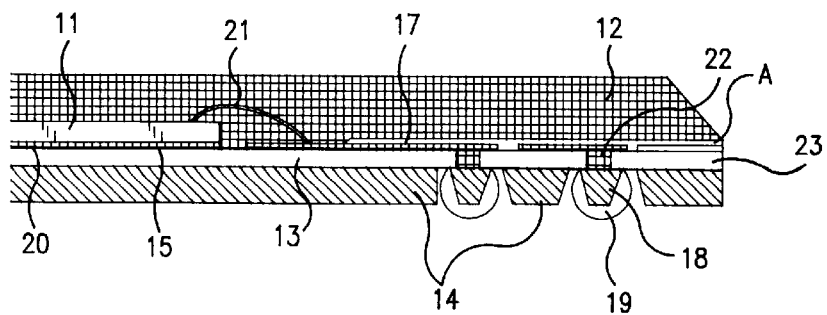

FIGS. 5A, 5B and 5C illustrate a laminate package structure of a metal BGA according to a first embodiment of the invention. When constructing a a laminate package structure according to the present embodiment, there is first provided a Cu substrate referred to as a metal base, designated at numerals 14 and 18 at a stage after a patterning thereof, the metal base having a thickness in a range from 0.15 to 0.20 mm. A polyimide layer 13 having a thickness in a range from 0.20 to 0.55 $\mu$m is formed on the surface of the substrate 14 and 18, and is overlaid with patterns 15 and 17 made of copper foils having a thickness in a range from 0.18 to 0.35 $\mu$m. The patterns of the copper foils includes an island pattern 15 which defines an area on which an LSI (semiconductor chip) 11 is mounted, and internal wiring (interconnect) patterns 17 extending over the front surface of the substrate and electrically connected to electrodes of the LSI 11 by bonding wires 21.

The metal base disposed around the rear surface of the package structure has a single ground pattern 14 which supports the whole laminated structure, and a plurality of land patterns 18 which are separated from each other and from the ground pattern 14 by a patterning process and on which solder balls 19 are to be formed. Each land pattern 18 is of a columnar configuration having a small diameter tip, and is located in concentric relationship with a columnar hole formed in the ground pattern 14 which surrounds the same. The land patterns 18 are used for signal lines and power supply lines while the ground pattern 14 is maintained at the ground potential, and thus, serves as a ground line. With such a structure in which the land patterns 18 and the ground pattern 14 are formed as a coaxial structure, a desired matched impedance such as 50 or 75Ω can be obtained.

To allow an electrical conduction between the land patterns 18 as well as the ground pattern 14 on the rear surface of the substrate and the internal wiring pattern 17 as well as the island pattern 15 on the front surface of the substrate, openings each having a diameter in the range from 20 to 30 $\mu$m are formed to extend through the copper foils 15 and 17 and polyimide layer 13. The openings are filled by a conductive material to define via-plugs 22, by conducting an electrolytic plating which utilizes the metal bases 14 and 18 implementing one of the electrodes for the plating on the rear surface of the package structure. In this manner, the respective metal base patterns 14 and 18 and the copper foil patterns 15 and 17 are electrically connected together through corresponding via-plugs 22. The via-plugs 22 may be formed by an electroless plating instead of the electrolytic plating.

A nickel plating or a gold plating is applied to each pattern after the patterns 15 and 17 on the front surface, the patterns 14 and 18 on the rear surface and the interconnections therebetween are formed, thus forming a metal BGA package 10 according to the present embodiment. During packaging of the semiconductor device, an LSI 11 is mounted on top of the island pattern 15 with a conductive adhesive 20 such as silver paste interposed therebetween, and connections between individual electrodes of the LSI 11 and the internal wiring patterns or interconnect patterns 17 are made by using bonding wires 21. Subsequently, an insulating resin 12 encapsulating the LSI 11, the bonding wires 21 and part of the internal wiring patterns 17 therein is applied, thereby obtaining an assembly hermetically sealed. Finally, a solder ball 19 is formed to cover the entire surface of each land pattern 18 of the metal base.

A package in which solder balls 19 are provided in the form of a grid as shown in FIGS. 1A, 1B and 1C is generally referred to as a BGA structure, and the BGA according to this embodiment which employs the metal base is herein referred to as a metal BGA (MBGA). It is to be noted that the encapsulated structure is not limited to a molding structure, but it is also possible to employ a cap encapsulation using a hollow cap.

When using the molding encapsulation, it is preferred that a coating of fluorine-contained resin be applied to an area including the island pattern on the front surface and part of the wiring patterns which is utilized to provide a bonding. Alternatively, it is also possible to apply a similar coating to a region of the rear surface of the package where the metal base is etched away to exhibit no metal base pattern. In the MBGA of the present embodiment, it is possible to configure the copper foils into co-planar structure of interconnections.

Second Embodiment

Figure 6A:
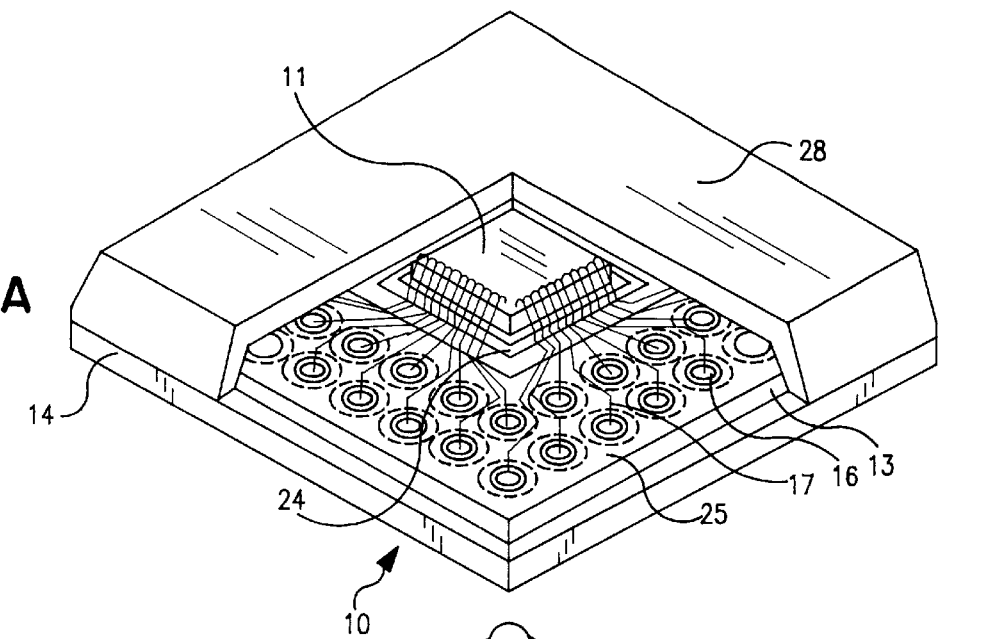
FIGS. 6A, 6B and 6C show, similarly to FIGS. 1A, 1B and 1C, a laminate package structure according to a second embodiment of the invention.
Figure 6B:
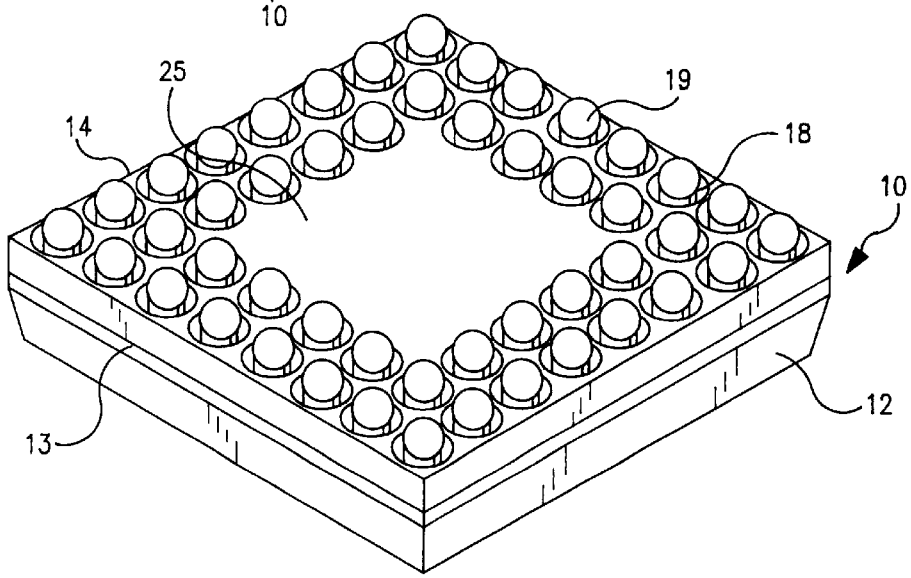
Figure 6C:
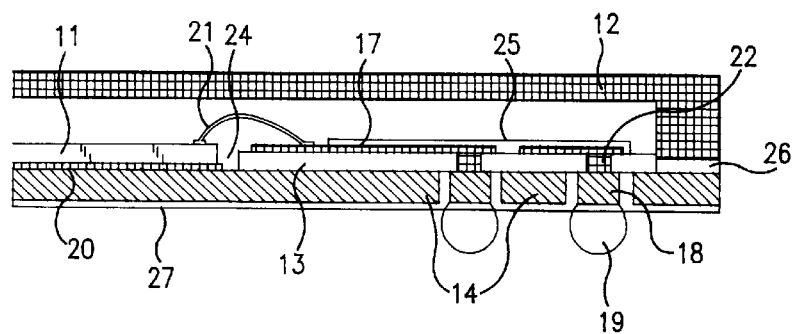

FIGS. 6A, 6B and 6C illustrate a laminate package structure of MBGA 10 according to a second embodiment of the invention. The MBGA of the present embodiment has a similar fundamental structure to that of the MBGA of the first embodiment, with exceptions described below.

In the present embodiment, the island pattern 15 and its underlying polyimide layer 13 of the first embodiment are removed to form a cavity 24, where the ground pattern 14 of the metal base is exposed to the front side of the package. The polyimide layer 13 is also removed along the outer periphery of the package, similarly exposing the ground pattern 14 of the metal base at the front side of the package. A coating resin layer 27 made of an insulating flourine-contained resin is applied to the rear surface of the ground pattern 14, while a coating resin layer 25 made of a similar material is applied to the front surface of the internal wiring pattern 17 and via-plugs 22.

In the MBGA 10 of the present embodiment, an LSI 11 is disposed in the region of the cavity 24. Initially, an adhesive resin or resin such as silver paste which exhibits a high thermal conductivity is used in disposing the LSI 11 within the cavity 24. Bonding wires 21 are then used to connect between the individual electrodes of the LSI 11 and the internal wiring patterns 17. Subsequently, a metal cap 28 is bonded to the ground pattern 14 of the metal base, which is exposed along the outer periphery of the package, by using a conductive adhesive 26 which similarly exhibits a high thermal conductivity, thus encapsulating the LSI 11, the bonding wires 21, the internal wiring patterns 17 and via-plugs 16 in its internal space. Finally, solder balls 19 are formed on respective land patterns 18 to which no coating of flourine-contained resin is applied, thus obtaining a semiconductor device.

In the present embodiment, the use of the ground pattern 14 having a ground potential in a similar manner to that in the first embodiment assures the stability of the ground potential on the rear surface of the LSI 11. Mounting the LSI 11 on the front surface of the ground pattern 14 with the interposition of a resin layer 20 which exhibits a high thermal conductivity allows the heat dissipating capability from the rear surface of the LSI to be improved. Similarly, direct bonding of the metal cap 28 to the metal base 14 by using a conductive resin allows the metal cap 28 to be maintained at the ground potential. Accordingly, the LSI 11 is surrounded by the cap 28 and the ground pattern 14, both of which are maintained at the ground potential, whereby it is effectively shielded from external high frequency noises.

Third Embodiment

Figure 7A:
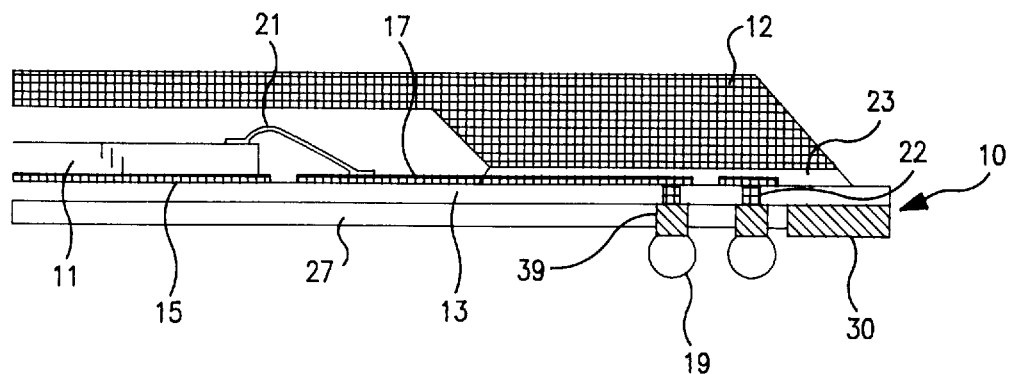
FIGS. 7A and 7B are fragmentary cross-sectional view and a perspective view of the rear surface, respectively, of a laminate package structure according to a third embodiment of the invention.
Figure 7B:
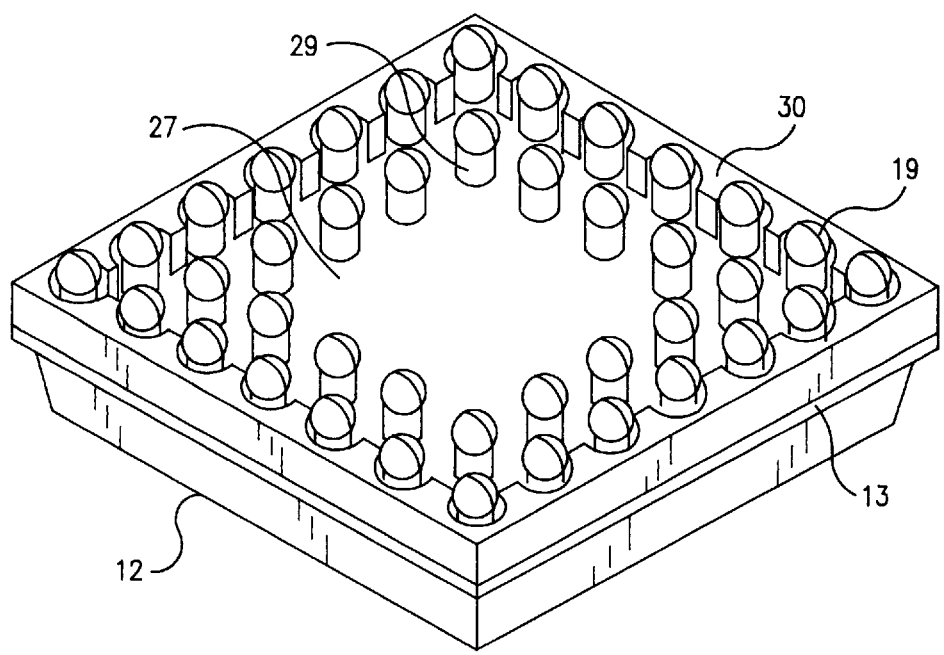

FIGS. 7A and 7B illustrate a laminate package structure of MBGA according to a third embodiment of the invention. The structure of the copper foils 17 and the polyimide layer 13 used in the present embodiment are similar to those illustrated in the first embodiment, except that the present embodiment differs from the first embodiment in the following points: first of all, a metal base has a ring pattern 30 in the shape of a picture frame defined around the outer periphery of the package, and a plurality of land patterns 29 which are located inside the inner periphery of the ring pattern and arranged in a grid shape similar to that shown in the first embodiment. The inside of the ring pattern 30 is filled by a transparent, flourine-contained resin coating layer 27 except for circular areas, formed by the surface of the individual land patterns 29.

An LSI 11 is disposed on an island pattern 15 which is formed on the polyimide layer 13. A cap 12 is bonded to the polyimide layer 13 by using an insulating adhesive 23. With the configuration of the present embodiment, the entire package can be supported by the frame pattern 30, which configuration allows a large number of land patterns 29 to be formed while maintaining the strength and the flatness of the package, and thus accommodates for an increase in the number of pins in a facilitated manner.

Fourth Embodiment

Figure 8A:
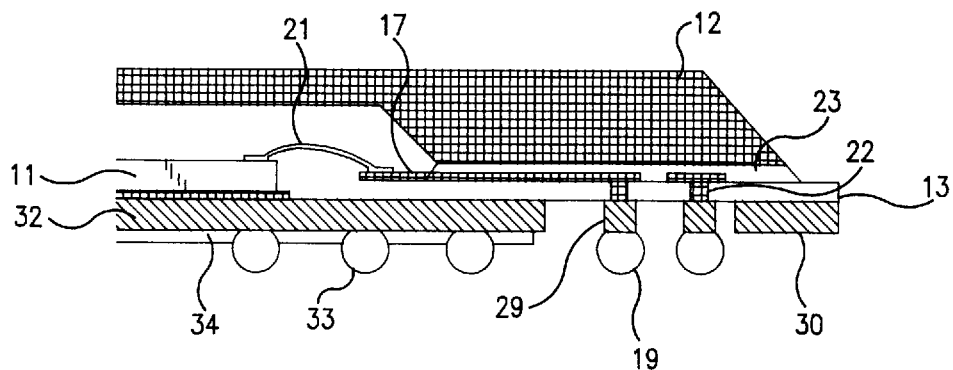
FIGS. 8A and 8B show a laminate package structure according to a fourth embodiment of the invention similarly to FIGS. 7A and 7B, respectively.
Figure 8B:
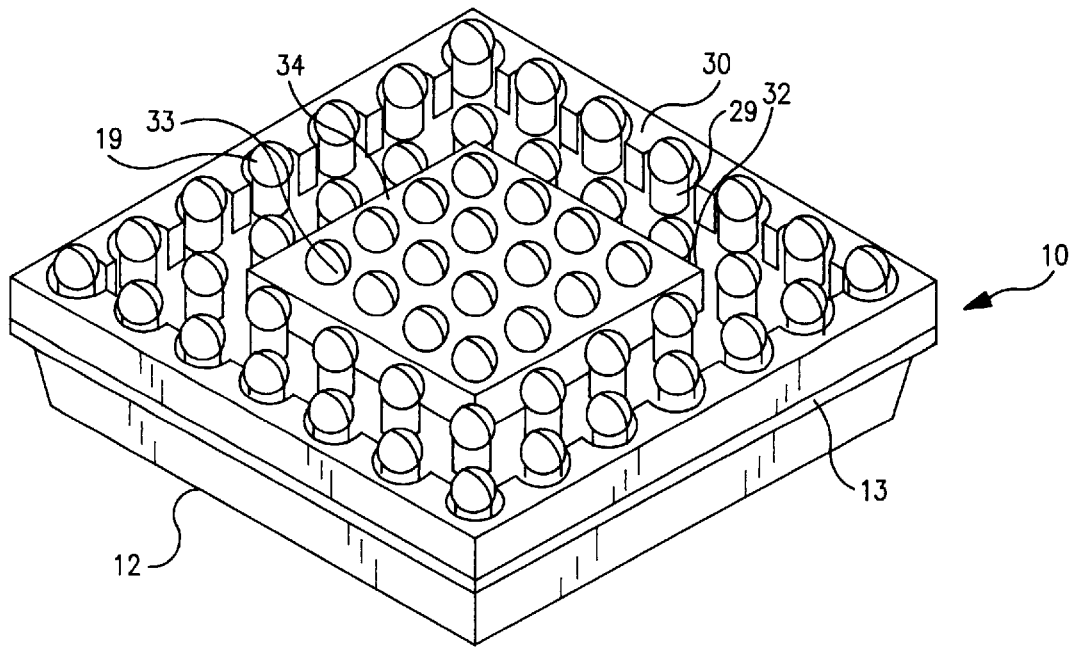

FIGS. 8A and 8B illustrate a laminate package structure of a MBGA according to a fourth embodiment of the invention. The fundamental structure of the MBGA according to the present embodiment is similar to that of the second embodiment with differences, including the cap 12, which are mentioned below. Specifically, in the present embodiment, an entire metal base is divided into three sections including a ring pattern 30 extending around the outer periphery of the package, a plurality of land patterns 29 disposed in the form of a grid, and a heat dissipating pattern 32 which also serves as a ground pattern. A coating of solder resist 34 is applied to the heat dissipating pattern 32, by a coating process, during which a number of patterns, similar in configuration to the land patterns 29, are formed in the heat dissipating pattern 32, thereby exposing the metal base in such regions. Solder balls 19 for electric connection and heat dissipating solder balls 33 are formed on the surface of the individual land patterns 29 and the surface of the heat dissipating pattern 32 where the metal base is exposed, respectively. With the structure of the present embodiment, heat generated on the rear surface of the LSI 11 can be efficiently dissipated to the exterior of the package through the heat dissipating pattern 32 and the heat dissipating solder balls 33 which exhibit a reduced heat resistance.

Fifth Embodiment

Figure 9A:
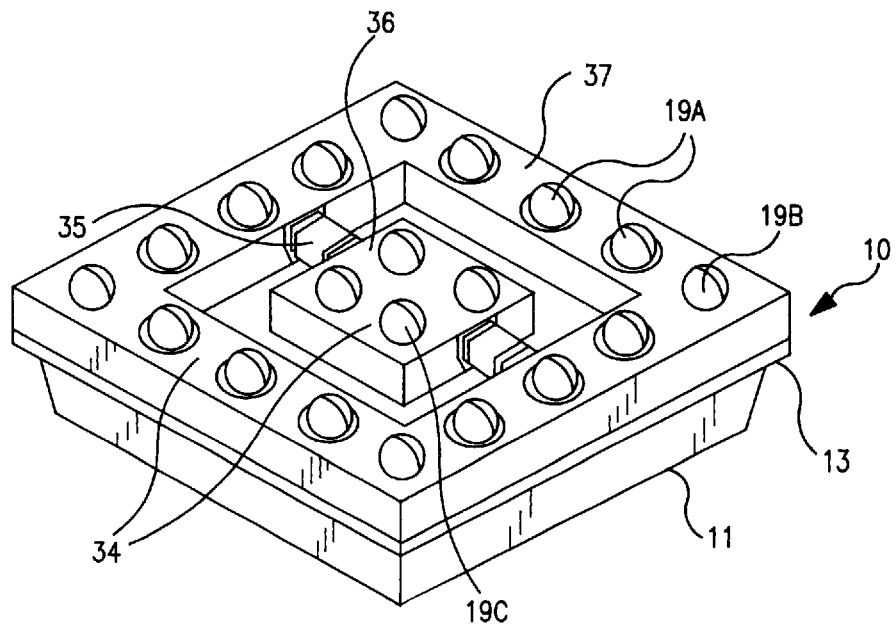
FIGS. 9A and 9B show a laminate package structure according to a fifth embodiment of the invention similarly to FIGS. 7A and 7B, respectively.
Figure 9B:
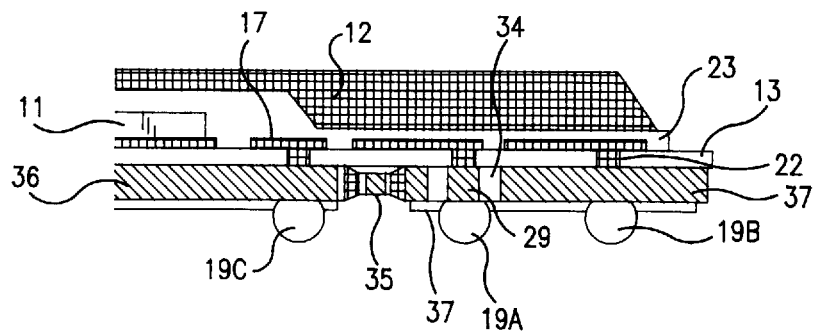

FIGS. 9A and 9B illustrate a laminate package structure of a MBGA according to a fifth embodiment of the invention. The fundamental structure of the MBGA of the present embodiment is similar to the first embodiment with differences which are described below. A metal base is divided into a ring-shaped ground pattern 37 extending around the outer periphery of the package, a centrally located power supply pattern 36 disposed at a given distance from the ground pattern 37, and a plurality of land patterns 29 disposed inside the ring-shaped ground pattern 37. In this manner, it is possible to provide a ground pattern 29 for signals within the ground pattern 37 while insulated therefrom. A chip capacitor 35 is disposed in the gap between the ring-shaped ground pattern 37 assuming a ground potential and the power supply pattern 36 assuming a power supply potential and is mounted thereon by means of a high melting solder. In each exposed position of the metal base, a signalling solder ball 19A is formed on top of the land pattern 29, GND solder 19B is formed on top of the ground pattern 37, and a power supply solder ball 19C is formed on top of the power supply pattern 36. In the present invention, the power supply pattern 36 is referred to as one of ground patterns since the potential may be reversed relative to the ground pattern 37.

In this embodiment, by changing the configuration of the metal base such as the internal wiring pattern 17, land pattern 29, power supply pattern 36 and ground pattern 37 in various manners, it is possible to mount chip components other than a chip capacitor such as a chip resistor, a chip inductor or the like in a similar manner.

Sixth Embodiment

Figure 10:
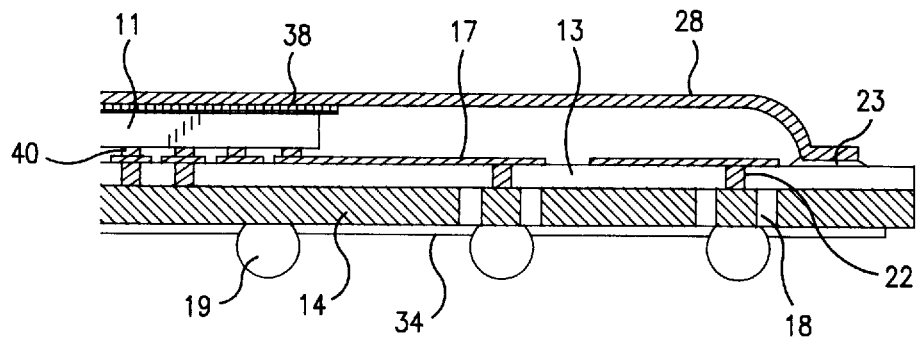
FIG. 10 is a fragmentary cross-sectional view of a laminate package structure according to a sixth embodiment of the invention.
Figure 11:
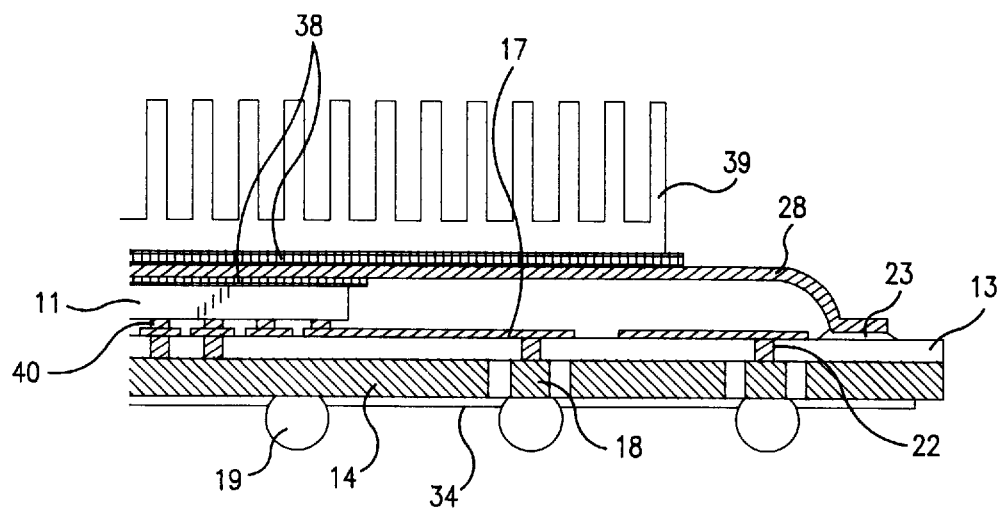
FIG. 11 is a fragmentary cross-sectional view of a modified laminate package structure according to the sixth embodiment of the invention.

FIG. 10 shows a laminate package structure of a MBGA according to a sixth embodiment of the invention. The package of the present embodiment is constructed to allow a flip chip connection in which connections between internal wiring patterns 17 and electrodes of the LSI 11 are made through minute flip chip bumps 40. Flip chip bumps 40 are previously formed on the internal wiring patterns 17 or on the LSI 11 for this purpose. This connection scheme is generally referred to as a flip chip connection. Some of the flip chip bumps 40 are also connected to the ground pattern 14 of the metal base through via-plugs 22, thus improving the heat dissipating capability. A metal cap 28 is bonded to the polyimide layer 13 with an insulating adhesive 23, and the internal space of the cap 28 hermetically encapsulates the LSI 11, the internal wiring and the like. The top surface of the LSI 11 and the metal cap 28 are bonded together with a heat conductive adhesive 38, which facilitates dissipation of heat generated within the LSI 11 through the metal cap 28. To further enhance the heat dissipating effect, a heat sink 39 is formed on the metal cap 28, as shown in FIG. 11, for example, illustrating a modified example of the sixth embodiment.

Seventh Embodiment

Figure 12A:
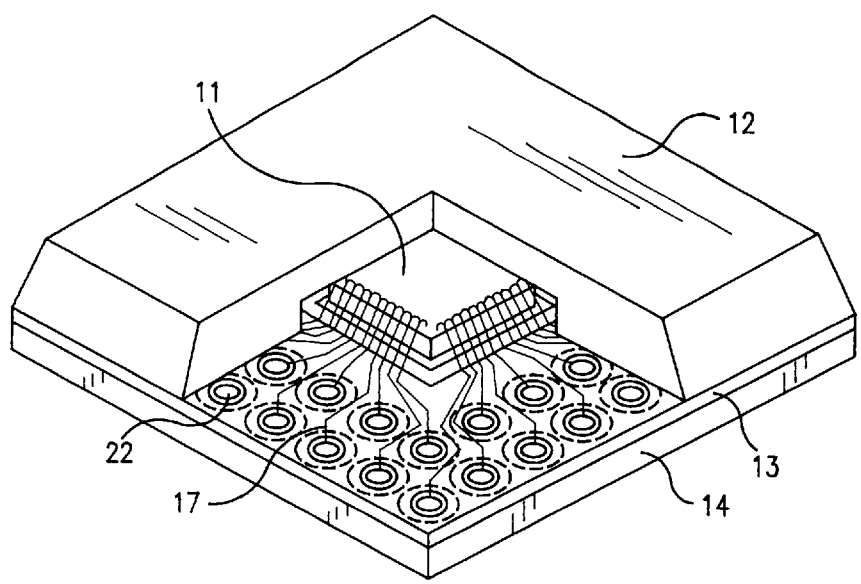
FIGS. 12A, 12B and 12C show a laminate package structure according to a seventh embodiment of the invention similarly to FIGS. 1A, 1B and 1C, respectively.
Figure 12B:
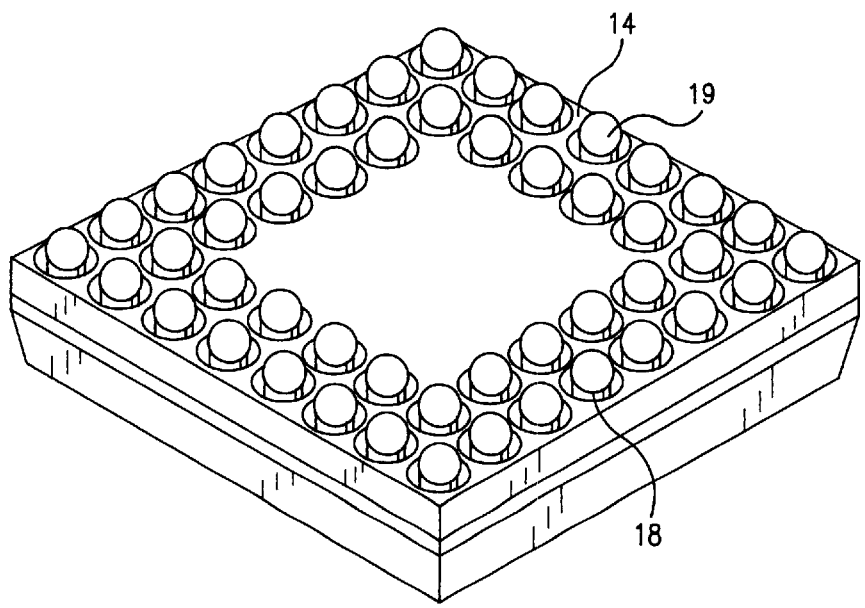
Figure 12C:
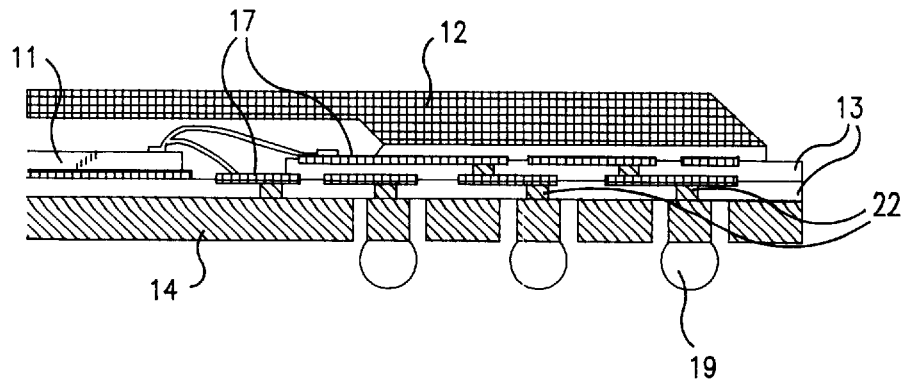

FIGS. 12A, 12B and 12C illustrate a laminate package structure of a MBGA according to a seventh embodiment of the invention. In the present embodiment, the copper foil scheme at the front side of a metal base 14 and constituting internal wiring patterns 17 is of a two-layer structure. Electrical conductions between the copper foil patterns 17 on the first layer and the second layer takes place through via-plugs 22. Any desired number of layers greater than two may be employed for the internal wiring patterns 17. In particular, the present embodiment is designed to facilitate an increase in the number of pins.

Eighth Embodiment

FIG. 13 illustrates a process for manufacturing a laminate package structure of a MBGA according to an eighth embodiment of the invention, the process including steps (a) to (g).

Step(a)

On top of a metal base 41 formed of a metal sheet having a thickness in a range from 0.15 to 0.20 mm is formed a polyimide layer 42 having a thickness in a range from 0.20 to 0.55 $\mu$m, which is in turn overlaid with a copper foil 43 having a thickness in a range from 0.18 to 0.35 $\mu$m, thus forming a metal laminated structure or a wired substrate, to which subsequent steps to be described below are applied.

Step(b)

By using a patterning which uses a photoresist, the metal base 41 is configured into a single ground pattern 14 and a plurality of land patterns 18.

Step(c)

After removing the photoresist by exfoliation, the entire rear surface including the rear surfaces of the patterns 14 and 18 of the metal base is coated by a masking resin 46. Subsequently, the copper foil 43 on the front surface is patterned, defining a plurality of openings 45 in the copper foil 43 in order to define through-holes. If required, an opening to define a cavity may be formed in the copper foil 43.

Step(d)

Using the copper foil 43 as a mask, the polyimide layer 42 is etched, defining an opening 47 in the polyimide layer which exposes the metal base patterns 14 and 18. It is possible to form a cavity as illustrated in the second embodiment at this step.

Step(e)

Nickel electroless plating 48 is applied to the entire front surface, thus forming the via-plugs 22. This allows an electrical conduction between the copper foil pattern 43 on the front surface and the metal base patterns 14 and 18 on the rear surface through the via-plugs 22. Subsequently, an electrolytic nickel plating is conducted using the via-plugs 22, which are formed by the electroless plating, as an electrode for the electrolytic plating, thus embeding nickel inside of the through-holes. It is to be noted that the electroless plating and the electrolytic plating mentioned above are not limited to nickel, but copper, tungsten or other metals may be used as well.

Step(f)

By patterning the copper foil 43 on the front surface using a photoresist, internal wirings 17 are defined.

Step(g)

The coating material 46 on the rear surface is removed, and an electroless nickel plating is applied to each pattern on both the front and the rear surfaces, followed by a gold plating. This provides an MBGA according to the present embodiment of the invention. It will be appreciated that cleaning operation and/or thermal treatment is made between successive steps, as required.

Ninth Embodiment

FIG. 14 illustrates a process for manufacturing a laminate package structure of a BGA according to a ninth embodiment of the invention, the process including steps (a) to (j) and steps (a') to (g'). As shown, a first wired substrate 50 is formed through steps (a) to (d) while a second wired substrate 55 is formed through steps (a') to (g'), and both of the substrates are bonded together at subsequent steps (h) to (j) to form a single bonded substrate 56. The method of the present embodiment is suitable for use in manufacturing a package which accommodate for a flip chip connection, in particular. It is to be noted that a cleaning operation and/or a thermal treatment takes place in a suitable manner between successive steps.

Steps (a) and (a')

Formed on the metal base 41 having a thickness in a range from 0.15 to 0.20 mm is a polyimide layer 42 having a thickness in a range from 0.20 to 0.55 $\mu$m, which is in turn overlaid with a copper foil 43 having a thickness in a range from 0.18 to 0.35 $\mu$m, thus forming a metal laminated substrate. It is to be understood that materials and thicknesses are suitably modified as required.

Steps (b) and (b')

The copper foil 43 is patterned to define a plurality of openings 45 at given locations in order to form through-holes.

Steps (c) and (c')

Using the copper foil pattern 43 as a mask, the polyimide layer 42 is patterned to form a plurality of openings 47 in the polyimide layer 42 to define through-holes, thus exposing the metal base 41 at the through-holes.

Steps (d) and (d')

Conducting an electrolytic plating using the metal base 41 as an electrode, a nickel plating is made to fill the openings 47 in the polyimide layer 42 as shown at 49. In this manner, a plurality of via-plugs are formed, completing electrical connections between the metal base 41 and the copper foil patterns 43. The plating should be executed such that the plated nickel 49 projects on the order of several tens of microns ($\mu$m) above the surface of the polyimide layer 42. The substrates formed by the steps (d) and (d') are referred to as a first and a second wired substrates 50 and 51', respectively.

Step (e')

Additionally, a polyimide layer 52 is spin coated on the entire front surface of the second metal substrate 51.

Step (f')

A resist patterning is applied to the polyimide layer 52 of the second wired substrate 51, and a plurality of openings 53, which later define through-holes, are formed at given locations on the copper foil pattern 43. The openings 53 expose portions of the copper foil pattern 43.

Step (g')

An electrolytic nickel plating is conducted using the copper foil patterns 43 of the second wired substrate 51 as electrodes for the plating, and the openings 53 in the polyimide layer 52 are filled with nickel 54, thus forming via-plugs which are electrically connected with the copper foil patterns 43. These steps provide a modified second wired substrate 55. The plating is executed such that the nickel 54 projects on the order of several to several tens of microns above the surface of the polyimide layer 52.

Step (h)

Disposing the first wired substrate 50 and the second wired substrate 55 so that their front surfaces are opposite to each other, an alignment is made such that the respective copper foil patterns 43 and the mating projecting plated metals 49, 54 are disposed in contact with each other at given locations. In this instance, it is also possible to make an arrangement such that the respective plated projections 49 and 54 are located so as to be partly opposite to each other, as shown in the drawing.

Step (i)

The first wired substrate 50 and the second wired substrate 55 are bonded together by a thermo-compression press. Alternatively, the bonding may utilize an adhesive or a chemical reaction. In this manner, there is obtained a bonded substrate 56 having the metal base 41 formed on both the front and the rear surfaces.

Step (j)

The metal bases 41 exposed on the opposite surfaces of the bonded substrate 56 are patterned respectively. The metal base 41 of the first wired substrate 50 is configured into a ring pattern 30 and flip chip bumps 40 while the metal base of the second wired substrate 51 is patterned while its surface is being coated, and is then configured into a ground pattern 14 and a plurality of land patterns 18. An LSI is mounted on the first wired substrate 50 by using a flip chip bonding, and a cap is adhesively bonded to the ring pattern 30 thereby obtaining a hermetic encapsulation. Electrical connections between the flip chip bumps 40 as well as the ring pattern 30 of one of the substrates and the land patterns 18 as well as the ground pattern 14 of the other are established through copper foil patterns 43 and via-plugs 49 and 54.

Tenth Embodiment

Figure 15A:
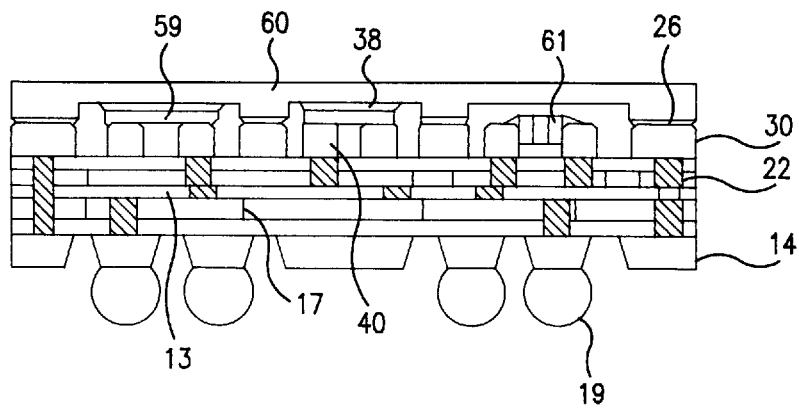
FIGS. 15A and 15B are cross-sectional view and a plan view, respectively, of a laminate package structure according to a tenth embodiment of the invention.
Figure 15B:
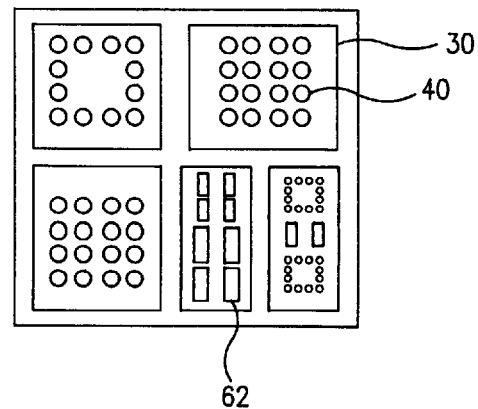

FIGS. 15A and 15B illustrate a semiconductor device including a laminate package structure of a MBGA according to a tenth embodiment of the invention, FIG. 15A being a cross-sectional view after a packaging process, FIG. 15B being a plan view showing the internal arrangement. The structure of the present embodiment may be formed by using the method of manufacturing as described in connection with the ninth embodiment. While the present embodiment will be described below as a multi-chip package, it is also applicable to a single chip package.

A flip chip bump 40, an electrode 62 for a chip component and a ring pattern 30, which are obtained by patterning the metal base on the front surface, have a height on the order of 50 to 100 μm. An area for an LSI 59, an area for a chip component such as a chip capacitor 61 or the like, and an area in which an LSI and a chip component exist in admixture are partitioned by the ring pattern 30. By way of example, when a low frequency LSI and a high frequency LSI are to be assembled into a common package, a cross-talk between these LSI's can be reduced by sealing individual areas by the use of a metal cap 60, a conductive resin 26 and the ring pattern 30.

Thus, an electrostatic and a magnetic shielding between a plurality of chips in one package as well as between the chips and the exterior is enabled. The electrodes of the LSI 59 are connected to the flip chip bumps 40 by using an adhesive or a low melting metal. The rear surface of the LSI is adhesively bonded to the metal cap 60 through a highly heat conductive resin 38 interposed therebetween. The land patterns 18 and the ground pattern 14, which are obtained by patterning the metal base on the rear surface of the package, have a height on the order of 150 to 200 μm.

In a MBGA package using a metal substrate as described in the above embodiment, a material such as a metal exhibiting a high thermal conductivity, for example, copper, is used as a base material, and each individual pattern and through-holes are formed by a resist patterning technique, and a hermetic encapsulation applied by using the cap, with consequent effects and advantages as described below.

The use of a metal exhibiting a high thermal conductivity for the base material of the package reduces the heat resistance and improves the heat dissipating capability. The heat dissipating capability is further improved if a cavity is formed to allow an LSI to be directly mounted on the metal base.

In packages of the embodiments described above, through-holes are formed by a photoresist and etching technique, and this allows through-holes to be formed which have fine diameters of 20 to 30 μm. Accordingly, when filling the through-holes with a plating material, the interior of the through-holes is completely filled with a plating metal. Accordingly, in distinction to a conventional BGA, there is little possibility of an ingress of a moisture through the through-holes. In addition, where a metal cap is used, a particularly favourable, hermetically encapsulated structure can be realized, preventing substantially any possibility of ingress of moisture through and around the cap. For the reasons mentioned above, the MBGA has an improved resistance to humidity.

Where a structure is adopted in which an insulating polyimide layer is exposed, it is to be noted that the polyimide layer is susceptible to the ingress of moisture. Accordingly, it is preferred that the ingress of moisture be avoided by coating the surface of the polyimide layer by flourine-contained resin or replacing the polyimide layer by another insulating material, for example, a Teflon layer in the associated metal laminated substrate.

The strength of connection and the reliability where the MBGA according to the invention is actually mounted will now be considered. In a conventional implementation, a choice is made so that a thermal expansion coefficient of a printed circuit board be substantially equal to a thermal expansion coefficient of a package. However, it is difficult to avoid a difference in the thermal expansion coefficient depending on the size of the printed circuit board or the location of its mounting, giving rise to stresses produced in the solder balls, which represent factors determining the reliability and the life of the implemented semiconductor device.

In the MBGA's of the above described embodiments, the polyimide layer exhibits a thermal expansion coefficient which is higher as compared with the thermal expansion coefficient of the printed circuit board, producing thermal stresses between different materials. Stresses which are produced depending on the size of the circuit board and the mounting location are further added. However, the solder balls are formed on top of the columnar metal base (land pattern) having a diameter on the order of 0.15 to 0.20 μm, and movement of the columnar metal base around an interface of adhesion with the polyimide layer allows the thermal stresses produced in the solder balls to be absorbed by the columnar metal base, thereby enhancing the reliability and increasing the useful life in the actual implementation as compared with a conventional package.

Considering the aspect of electrical characteristics, it is a simple matter in the MBGA's of the invention to form an internal wiring as a micro-strip line scheme. By optimizing the diameters of the land patterns and the ground pattern, a coaxial construction which exhibits a desired characteristic impedance is formed. In addition, by selecting suitable patterns for the metal base, as exemplified in the tenth embodiment, chip components such as chip capacitors may be mounted. A cross-talk noise between adjacent wires can be reduced by adopting hermetically encapsulated structure. As a result of these, an impedance matching within the package is facilitated.

By adhesively bonding a metal cap and a metal base with a conductive resin to maintain both of them at the ground potential, the interior of the package is electrically and magnetically shielded from the exterior. This arrangement allows the use of an LSI in the high frequency region.

It is to be noted that a material which constitutes a metal base may be suitably selected. For example, a metal base may be formed of copper, or a metal including aluminium as a main constituent or various other metals.

Since above embodiments are described only for examples, the present invention is not limited to such embodiments and it will be obvious for those skilled in the art that various modifications or alterations can be easily made based on the above embodiments within the scope of the present invention.

What is claimed is:

1. A laminate package structure for a semiconductor device comprising a metal base forming a plurality of base patterns including a plurality of land patterns and at least one ground pattern disposed in spaced relationship with said land patterns, wherein said at least one ground pattern includes a ring pattern disposed around an outer periphery of said package structure and a central pattern surrounded by said ring pattern, at least one of said ring pattern and central pattern being grounded, and insulating layer made of an organic insulator formed on said metal base, said insulating layer having a plurality of through-holes, a plurality of via-plugs each formed in a corresponding one of said through-holes, a metal foil layer forming a plurality of foil patterns formed on said insulating layer and including a plurality of interconnect patterns, said land patterns and ground patterns being connected to said interconnect patterns through said via-plugs.

2. A laminate package structure according to claim 1 further comprising a bump formed on a corresponding one of said interconnect patterns.

3. A laminate package structure according to claim 1 wherein said foil pattern further includes an island pattern on which a semiconductor chip is to be mounted.

4. A laminate package structure according to claim 1 wherein said base patterns further include an island pattern exposed in a cavity formed in said metal layer and insulating layer, said island pattern constituting a space for mounting a semiconductor chip.

5. A laminate package structure according to claim 1 wherein said at least one ground pattern includes a ring pattern disposed around an outer periphery of said package structure.

6. A laminate package structure according to claim 1 wherein said ring pattern and said central pattern define a space therebetween for mounting at least one chip component.

7. A laminate package structure according to claim 1 further comprising a coating resin layer covering said ground pattern and a space between said base patterns.

8. A laminate package structure for a semiconductor device comprising a metal base forming a plurality of base patterns including a plurality of land patterns and at least one ground pattern disposed in spaced relationship with said land patterns, an insulating layer made of an organic insulator formed on said metal base, said insulating layer having a plurality of through-holes a plurality of via-plugs each formed in a corresponding one of said through-holes, a metal foil layer forming a plurality of foil patterns formed on said insulating layer and including a plurality of interconnect patterns, said land patterns and ground pattern being connected to said interconnect patterns through said via-plugs, further comprising another insulating layer and another metal foil layer consecutively formed on said metal foil layer, said another insulating layer having at least one via-hole therein, and another via-plug formed in said via-hole, said another metal foil layer including another interconnect pattern connected to a corresponding one of said interconnect patterns through said another via-plug.

9. A laminate package structure according to claim 8 further comprising a cap, wherein said another metal foil layer further includes a ring pattern disposed around an outer periphery of said package structure, and said cap is bonded to said ring pattern.

10. A laminate package structure according to claim 1 further comprising a cap, wherein said metal foil pattern further includes a ring pattern disposed around an outer periphery of said package structure, and said cap is bonded to said ring pattern.

11. A laminate package structure according to claim 1 further including a cap, wherein said metal base is exposed from said metal foil layer and said insulating layer at ring portion of said metal base disposed around an outer periphery of said package structure, and said cap is bonded to said ring portion.

12. A laminate package structure according to claim 1 wherein said via-plug is formed of a plating layer.

13. A laminate package structure comprising a first laminate section, a second laminate section, a first insulating layer having a via-hole, and a via-plug formed in said via-hole, each of said first and second section including a metal base forming a plurality of base patterns including a plurality of land patterns and at least one ground pattern disposed in spaced relationship with said land patterns, a second layer made of an organic insulator formed on said metal base, said second insulating layer having a plurality of first through-holes, a plurality of first via-plugs each formed in a corresponding one of said through-holes, a metal foil layer forming a plurality of foil patterns formed on said second insulating layer and including a plurality of interconnect patterns, said land patterns and ground pattern being connected to said interconnect patterns through said first via-plugs, wherein said first laminate section and second laminate section are disposed opposite to each other, said second insulating layers of both said laminate sections being opposed to each other with said first insulating layer disposed therebetween, wherein said metal foil layers of both said laminate sections are connected to each other through said second via-plugs, and wherein said second laminate section further includes flip-flop bumps formed on said land patterns.

14. A laminate package structure according to claim 1 wherein said metal base contains at least one of Cu and Al as a main constituent thereof.

15. A semiconductor device including the laminate package structure as defined in claim 1 and a semiconductor chip bonded to said laminate package structure by one of organic resin, metal-mixed resin and a low melting metal.

16. A semiconductor device according to claim 15 further including a cap made of one of a metal and a resin, said cap being bonded to said laminate package structure.

17. A semiconductor device according to claim 15 further including a plurality of solder balls each formed on a corresponding one of said land patterns.

18. A semiconductor device according to claim 15 further including a plurality of solder balls formed in spaced relationship with said ground pattern.

19. A semiconductor device including the laminate package structure as defined in claim 2 and a semiconductor chip connected to said bump by flip chip bonding using one of resin and a low melting metal.

* * * * *

UNITED STATES PATENT AND TRADEMARK OFFICE
CERTIFICATE OF CORRECTION

PATENT NO. : 5,866,942
DATED : February 2, 1999
INVENTOR(S) : Suzuki et al

It is certified that error appears in the above-identified patent and that said Letters Patent is hereby corrected as shown below:

Claim 1, Col. 12, line 64, "and" should be - -an- -.

Signed and Sealed this

Seventh Day of December, 1999

Attest:

Q. TODD DICKINSON

Attesting Officer

Acting Commissioner of Patents and Trademarks